United States Patent [19]
Hepworth et al.

[11] 4,090,256
[45] May 16, 1978

[54] FIRST-IN-FIRST-OUT REGISTER IMPLEMENTED WITH SINGLE RANK STORAGE ELEMENTS

[75] Inventors: Edward C. Hepworth, Apache Junction; Rodney J. Means, Tempe, both of Ariz.

[73] Assignee: Motorola, Inc., Schaumburg, Ill.

[21] Appl. No.: 580,634

[22] Filed: May 27, 1975

[51] Int. Cl.² ............................................. G11C 11/34
[52] U.S. Cl. ................................. 365/154; 340/168 S
[58] Field of Search .......... 340/334, 173 FF, 173 CA, 340/174 SR, 168 S

[56] References Cited

U.S. PATENT DOCUMENTS

| 3,493,956 | 3/1970 | Andrews et al. | 340/334 |
| 3,835,466 | 9/1974 | Bieszczad et al. | 340/334 |
| 3,919,699 | 11/1975 | Hideshima | 340/173 CA |

Primary Examiner—Marshall M. Curtis
Attorney, Agent, or Firm—Anthony J. Sarli, Jr.

[57] ABSTRACT

A first-in-first-out memory system is described in which the storage array is made up of single rank storage elements. Control logic means provide for sequencing the transfer of data within the storage array such that transfer can occur only between adjacent groups of storage elements for which a status record shows an empty data word preceded by a full data word.

8 Claims, 4 Drawing Figures

FIRST-IN-FIRST-OUT REGISTER IMPLEMENTED WITH SINGLE RANK STORAGE ELEMENTS

BACKGROUND

The present invention is directed to digital memory systems and more particularly to an improved first-in-first-out memory system.

In digital systems a frequent design problem is providing temporary storage for several discrete units of digital data. More particularly, the design requirement is often that the sequential order in which data entered the temporary storage be maintained. Thus, the requirement is that when several discrete units of data have been written into the memory, the result upon reading the memory will be that the first unit of data written into the memory will be the first unit of data read out of the memory. A memory system which operates in accordance with this operating requirement is commonly referred to as a first in-first out (FIFO) memory system. A number of different methods for implementing FIFO memory systems are shown in the prior art including embodiments which use shift registers, random access memories and barrel registers in which memory elements are interconnected in a recirculating mode. These embodiments require extensive control logic and are most effective in large systems where the overhead costs of the peripheral control logic can be shared by a large number of FIFO memory bits. Often however, the design requirement is for a small to medium size FIFO memory block incorporated in conjunction with a digital system. It may be desired, for example, to provide a small FIFO memory on a monolithic integrated circuit designed to provide a digital data processing or data communications function. The optimum solution to a design requirement of this type would be a FIFO memory which could be implemented using conventional storage elements such as flip-flops which would then be compatible with the other digital logic circuits used to implement the logic design on the integrated circuit.

In considering the design problem of implementing a FIFO memory with flip-flops, it would be highly desirable to be able to implement the design using single rank flip-flops. A single rank flip-flop, sometimes referred to as a latch, makes use of a single pair of cross coupled coincident gates together with whatever additional logic elements are required for clocking or steering data into its input. Although the simple latch provides the static storage of digital information with the minimum number of components, it suffers from the operational disadvantage that changes in input conditions when data is written into the latch are immediately applied as the output condition of the latch. This operating feature is a particular disadvantage in FIFO memory systems because the storage elements of the FIFO memory must be connected in tandem so that stored data can be shifted from one group of storage locations to the next in orderly sequence. Thus, if single rank storage elements are connected in a FIFO memory configuration with a common clock, an attempt at entering data at the input of the FIFO memory would cause data to ripple through all of the groups memory elements in an uncontrolled manner and a malfunction would result. Thus, in prior art solutions the FIFO designer was forced to make use of double rank flip-flop configurations to implement the FIFO memory. A double rank flip-flop is one in which two cross coupled coincident gate pairs are connected in tandem such that logic signals can be applied to the input of the flip-flop in writing without affecting the logic state present at the flip-flop output. This tandem connection buffers the output of the flip-flop against changes at the flip-flop input so that the results of writing new information into the flip-flop will result in a change at the flip-flop output in a controlled fashion. This additional control allows the design of a FIFO memory system in which data can be transferred sequentially from one group of storage elements to the next in an orderly fashion. The penalty, however, for implementing a FIFO memory system using double rank storage elements is that the total component count required to implement a FIFO memory of a given size roughly double that which would be required if it were possible to implement a FIFO memory system with single rank storage elements which used only a single cross coupled coincident gate flip-flop as the basic storage element. The missing element required to implement this simpler FIFO memory structure is a logic arrangement which can provide the necessary control for sequencing data through an array of single rank storage elements.

SUMMARY OF THE INVENTION

Accordingly, it is an object of this invention to provide an improved FIFO memory system.

It is a further object of this invention to provide an improved FIFO memory system which is implemented using single rank memory storage elements.

It is a further object of this invention to provide an improved FIFO memory system whose use of single rank storage elements allows it to be implemented in a simpler manner with a smaller number of logic elements.

It is a still further object of this invention to provide an improved FIFO memory system which can be implemented with minimal components in monolithic integrated circuit form resulting in an integrated circuit chip which is reduced in area and thus more economical to manufacture.

In accordance with the aforementioned objects, the present invention provides an improved FIFO memory system in which a novel control logic structure insures the sequential transfer of data only between groups of storage elements for which a status record shows an empty group of storage elements preceded by a full group of storage elements. This control logic arrangement allows the storage array to be implemented using simple single rank storage elements resulting in a logic structure with greatly reduced component count and cost.

DETAILED DESCRIPTION

Figure 1:
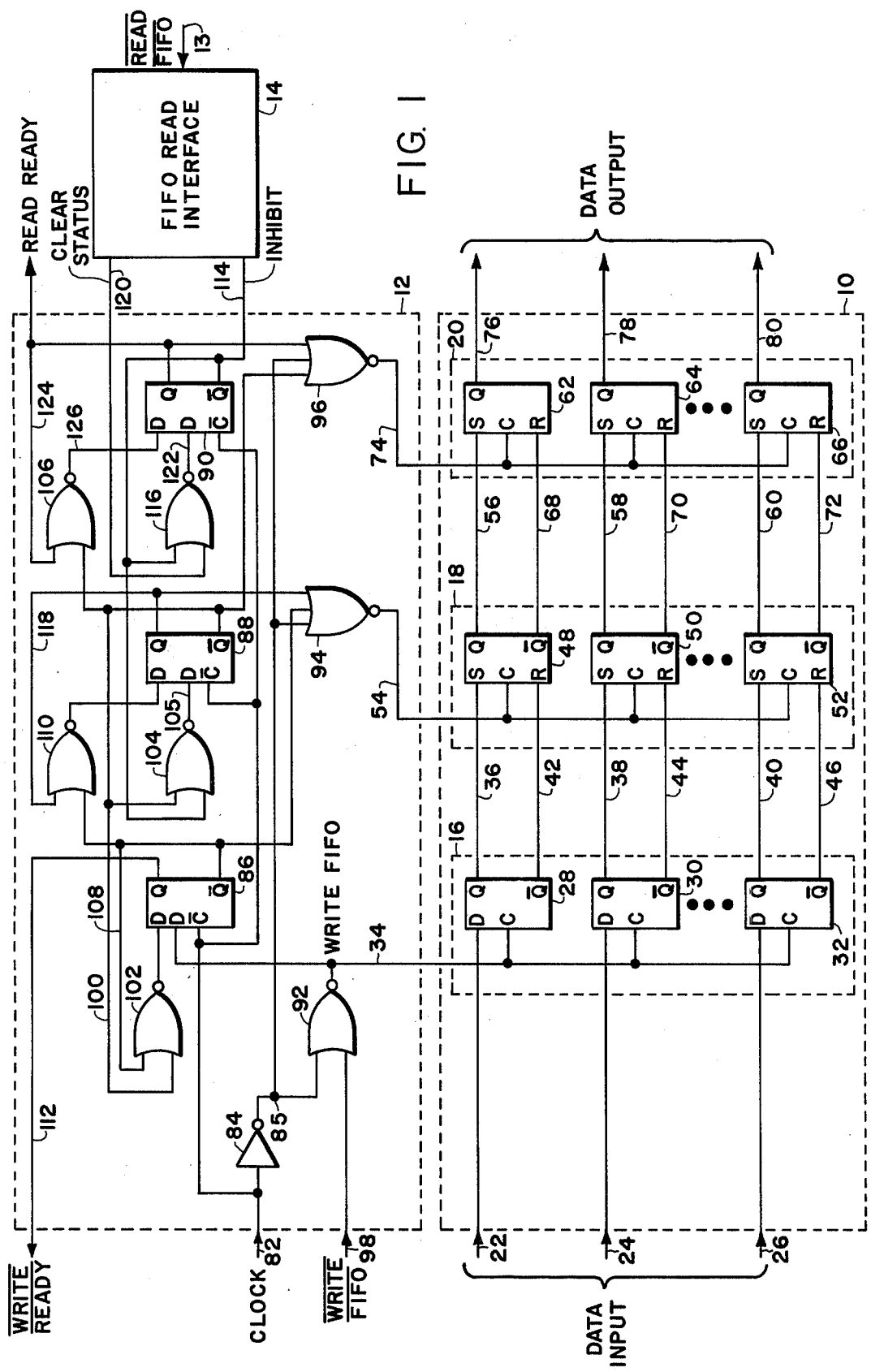
FIG. 1 is a logic diagram illustrating the FIFO memory system of the present invention.

FIG. 1 shows one particular embodiment of a FIFO memory system implemented with single rank storage elements. This system comprises a storage array 10 coupled to control logic 12 which is in turn coupled to a FIFO read interface 14. In this particular embodiment, the storage array 10 is made up of three data words 16, 18, and 20 each of which can store N bits of digital information. Input data to the storage array is coupled on data input conductors 22, 24 and 26 which couple to the inputs of storage elements 28, 30 and 32, respectively. A timing signal for clocking data into data word 16 is applied via conductor 34 which couples to the clock inputs of storage elements 28, 30 and 32. Data is transferred from the first data word 16 to the second data word 18 via conductors 36, 38 and 40 which connect to the set inputs of storage elements 48, 50 and 52 respectively, and by conductors 42, 44 and 46 which connect to the reset inputs of these same respective storage elements. The timing signal which allows data transfer into data word 18 is accomplished via conductor 54 which connects to the clock inputs of storage elements 48, 50 and 52 of data word 18. Similarly, the data transfer from data word 18 to data word 20 is accomplished via conductors 56, 58 and 60 which connect from the Q outputs of storage elements 48, 50 and 52, respectively to the set inputs of storage elements 62, 64 and 66 of data word 20 and by conductors 68, 70 and 72 which connect from Q output of storage elements 48, 50 and 52 of data word 18 to their respective reset inputs of storage elements 62, 64 and 66 of data word 20. The timing signal which accomplishes the data transfer into data word 20 is applied via conductor 74 which connects to the clock inputs of storage elements 62, 64 and 66 of data word 20. Output data from the storage array is transferred via conductor 76, 78 and 80 which connect to the Q outputs of storage elements 62, 64 and 66, respectively of data word 20.

Basic timing for the control logic 12 is provided by the clock signal on conductor 82 which connects to the input of inverter 84 and to the $\overline{C}$ inputs of the first status flip-flop 86, the second status flip-flop 88 and the third status flip-flop 90. The output of inverter 84 connects to an input of NOR gate 92 and to an input of NOR gates 94 and 96, respectively. The $\overline{\text{WRITE FIFO}}$ control input to control logic 12 connects to an input of NOR gate 92 via conductor 98. The output of NOR gate 92 connects to a data input of the first status register 86 and the clock inputs of the storage elements of data words 16 via conductor 34. Conductor 100 connects from the $\overline{Q}$ output of the second status register 88 to an input of NOR gate 102, an input of NOR gate 104, an input of NOR gate 106, and an input of NOR gate 96. Conductor 108 connects to the $\overline{Q}$ output of the first status register 86, an input of NOR gate 102, an input of NOR gate 110, and an input of NOR gate 94. The output of NOR gate 102 connects to a D input of the first status register 86. The Q output of the first status register 86 connects to conductor 112 which is the $\overline{\text{WRITE READY}}$ output signal from the control logic 12. The INHIBIT conductor 114 from the FIFO READ interface 14 connects to the $\overline{Q}$ output of the third status register 90, an input of NOR gate 116 and to an input of NOR gate 104. The output of NOR gate 104 connects to a D input of the second status register 88. The Q output of the second status register 88 connects to an input of NOR gate 94 and an input of NOR gate 110 via conductor 118. The clear status signal from FIFO read interface 14 connects to an input of NOR gate 116 via conductor 120. The output of NOR gate 116 connects to a D input of the third status register 90 via conductor 122. The Q output of the third status register 90 connects to an input of NOR gate 96 and an input of NOR gate 106 via conductor 124 which is also the READ READY output from the control logic 12. The output of NOR gate 106 connects to a D input of the third status register 90 via conductor 126.

Figure 3:
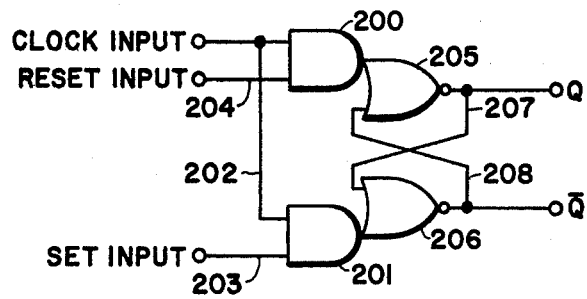
FIG. 3 is a logic diagram illustrating a single rank clocked set/reset flip-flop.

FIG. 3 shows a more detailed logic diagram of a clocked set/reset flip-flop shown in FIG. 1. This flip-flop is a single rank storage element. A clock signal is applied to an input of AND gate 200 and AND gate 201 via conductor 202.

The set input is applied to another input of AND gate 201 via conductor 203 and the reset input is applied to another input of AND gate 200 via conductor 204. The outputs of AND gates 200 and 201 coupled to the input of NOR gates 205 and 206, respectively. The outputs of NOR gate 205 couples to an input of NOR gate 206 and the output of NOR gate 206 couples to an input of NOR gate 205 via conductors 207 and 208, respectively, to form a cross coupled coincident gate flip-flop. The outputs of NOR gates 205 and 206 also form the Q and $\overline{Q}$ outputs of the flip-flop respectively.

Figure 4:
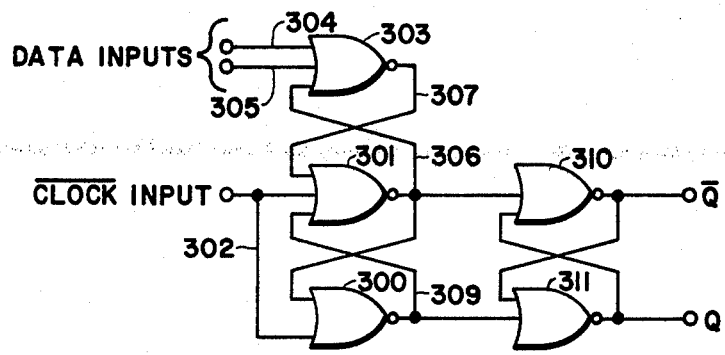
FIG. 4 is a logic diagram illustrating a double rank clock delay flip-flop.

FIG. 4 shows a more detailed logic diagram of the clocked data flip-flop shown in block form in FIG. 1. This delay flip-flop is a double rank storage element. The $\overline{\text{CLOCK}}$ input connects to an input of NOR gate 300 and an input NOR gate 301 via conductor 302. The two data inputs connect to inputs of NOR gate 303 via conductors 304 and 305, respectively. The output of NOR gate 301 is connected to an input of NOR gate 303 via conductor 306 and the output of NOR gate 303 is connected to an input of NOR gate 301 via conductor 307 to form a cross coupled input stage. The output of NOR gate 301 also couples to an input of NOR gate 300 via conductor 306 and the output of NOR gate 300 couples to an input of NOR gate 301 via conductor 309 to form a second cross coupled coincident gate stage. Conductor 306 also coupled to an input of NOR gate 310 and conductor 309 couples to an input of NOR gate 311. The output of NOR gate 310, which is the $\overline{Q}$ output of the flip-flop couples to an input of NOR gate 311 and the output of NOR gate 311 which is the Q output of the flip-flop couples to an input of NOR gate 310 forming an output cross coupled coincident gate stage.

Figure 2:
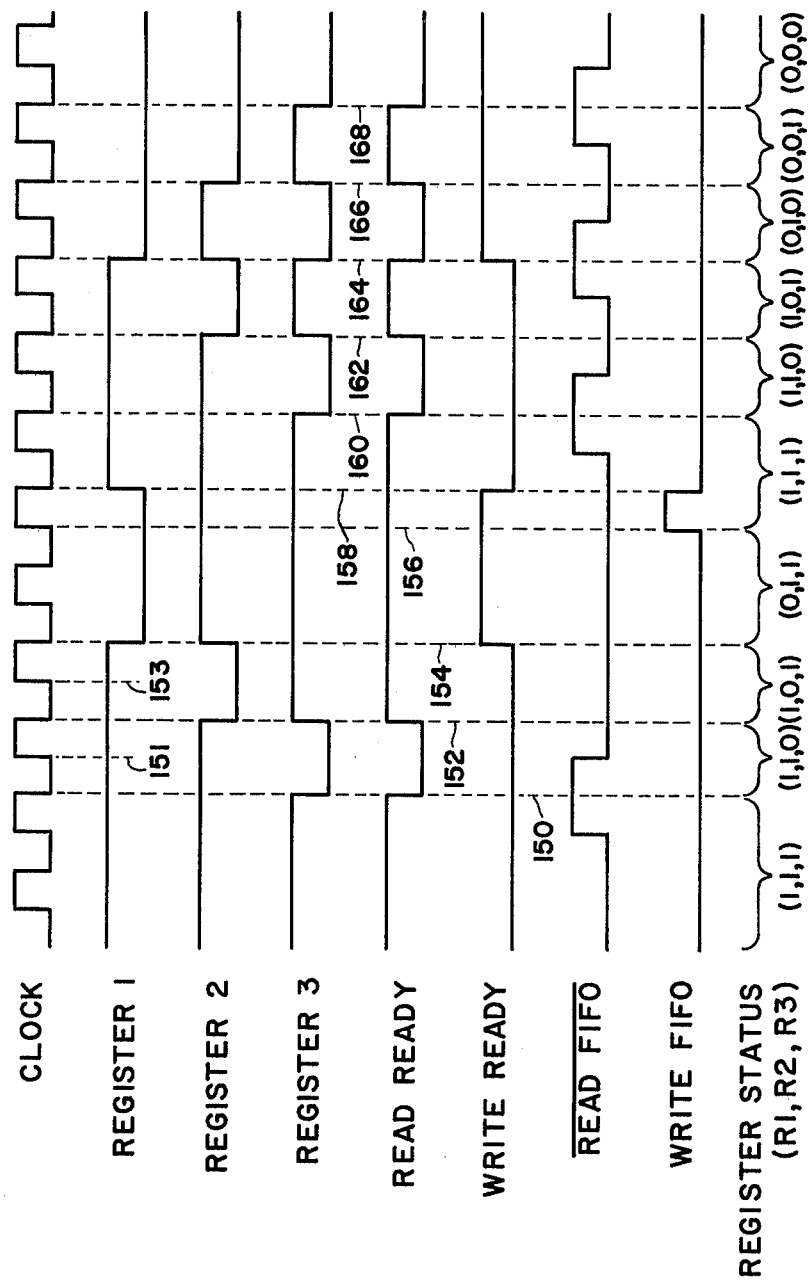
FIG. 2 is a timing diagram illustrating the operation of the FIFO memory system of FIG. 1.

Operation of the FIFO memory of this application is understood by considering the logic diagram of FIG. 1 in conjunction with the timing diagram of FIG. 2. As shown in FIG. 1, the logic structure of the FIFO memory is organized in a repetitive fashion. The storage array portion of the FIFO memory consists of data registers which are serially coupled one to the next. The transfer of data into each data register from the preceding data register is under the control of a transfer enable gate which connects to the clock input of each of the single rank flip-flops which make up the data register. This transfer enable gate responds to the logical state of the status flip-flops associated with the given data register and the preceding data register. Each data register is monitored by an associated status flip-flop. The logical state of this status flip-flop defines whether the associated data register is empty or full. The logical state of the status register flip-flop is changed by two control gates connected to its data inputs. These control gates comprise a first control gate for setting the status flip-flop in the "full" state when a data transfer into the associated data register has occurred and a second control gate for holding or clearing the status flip-flop. The functions of the second control gate are (1) holding the status flip-flop in the full state when there is no transfer of data out of the associated data register (2) holding the status flip-flop in the empty state when there is no transfer of data into the associated data register and (3) clearing the status flip-flop to the empty state when there is a transfer of data out of the associated data register.

In FIG. 1, a particular embodiment providing temporary storage for three data words, the repetitive logic structure is shown by data register 20 which uses transfer enable gate 96, status flip-flop 90, first control gate 106 and second control gate 116. Similarly data register 18 uses transfer enable gate 94, status flip-flop 88, first control gate 110 and second control gate 104. Data register 16 does not require a transfer enable gate as will be discussed in greater detail below but has the associated status flip-flop 86, first control gate 92 and second control gate 102. The status flip-flops 86, 88 and 90 shown in FIG. 1 are clocked double rank flip-flops each having two "data" inputs. The detailed logic structure of these flip-flops is shown by the logic diagram of FIG. 4. These flip-flops operate on a negative clock transition (from logical "1" to logical "0") and their operation is such that a logic "1" on either of the data inputs will result in the flip-flop being set to a logic "1" state (the Q output is equal to a logic "1") when the negative clock transition occurs. If both data inputs are at logic, "0", the flip-flop will be set in the logic "0" state when the negative clock transition occurs.

Referring now to the timing diagram of FIG. 2, the operation of the FIFO memory is described by first assuming that all of the data registers of the memory are full, i.e., that status registers 86, 88 and 90 are all in the logic "1" state. For convenience in considering the operation, the bottom of FIG. 2 shows an abbreviated register status notation. For the initial conditions just described, the register status is thus (1,1,1). All logic operations within the FIFO memory are controlled by the clock signal shown in FIG. 2. With all data words of the FIFO memory initially full, the Q output of the first status register 86 will produce a logic "1" on conductor 112 which is the $\overline{\text{WRITE READY}}$ signal to the system transmitting data into the FIFO. A logic "1" on the $\overline{\text{WRITE READY}}$ conductor indicates that the FIFO memory is full and no new data should be inputted. Similarly, the Q output of the third status register 90 is at a logic "1" which is then transmitted on conductor 124 as the READ READY signal to the system receiving data from the FIFO memory of FIG. 1. The logic "1" on the READ READY conductor indicates that the third data register 20 of the FIFO memory contains data which is available to be read on the data output conductors 76 through 80.

Now assume that data has been read from data word 20 so that it is now available for the storage of the next sequential data word. This availability is indicated by the logic "1" pulse on the $\overline{\text{READ FIFO}}$ conductor 13 which is an input to the FIFO READ INTERFACE 14. The logic "1" at time 150 produces a logic "1" on the CLEAR STATUS conductor 120 which is one input to the first control gate, NOR gate 116. The other input to NOR gate 116 connects to the $\overline{\text{Q}}$ output of the third status flip-flop 90 via conductor 114. Logic "1" and "0" at the inputs of NOR gate 116 produce a logic "0" at the output of NOR gate 116 which is then applied to one input of status flip-flop 90 via conductor 122. The negative clock transition applied to the $\overline{\text{C}}$ input of status flip-flop 90 thus causes it to change from the logic "1" to the logic "0" state as shown by the REGISTER 3 waveform at time 150 in the timing diagram of FIG. 2. Thus the status has changed to (1,1,0). This change in the status flip-flop 90 plus the fact that status flip-flop 88 is in the "1" state results in logic "0" on all three inputs of the transfer enable NOR gate 96 producing a logic "1" on conductor 74 which couples to the clock inputs of the single rank set/reset flip-flops 62, 64 and 66 of data word 20. Detailed logic structure for these single rank flip-flops is shown in the logic diagram of FIG. 3.

The new state of status flip-flop 90 establishes conditions for updating the status at the next negative clock transition at time 152. The logic "0" at the Q output of status flip-flop 90 and the logic "0" at the $\overline{\text{Q}}$ output of status flip-flop 88 connect to the inputs of NOR gate 106 resulting in logic "1" on conductor 126 which connects to an input of status flip-flop 90. This condition sets status flip-flop 90 to the logic "1" state at the next negative clock transition at time 152. Similarly, the logic "1" at the $\overline{\text{Q}}$ output of status flip-flop 90 which connects to an input of NOR gate 104 via conductor 114, forces the output of NOR gate 104 to logic "0". This logic "0" connects to an input of status flip-flop 88 via conductor 105 and establishes the condition which clears status flip-flop 88 to the logic "0" state at the next negative clock transition at time 152. Thus the status register is updated to the (1,0,1) state at time 152 indicating that the contents of data register 18 have been shifted into data register 20.

The operation of the logic of FIG. 1 now continues with the updated status (1,0,1) causing a similar sequence of actions during the clock cycle starting at time 152. The logic "0" at the Q output of status flip-flop 88 and the logic "0" at the $\overline{\text{Q}}$ output of status flip-flop 86 condition the inputs of transfer enable NOR gate 94 such that when CLOCK goes to the logic "1" state at time 153, the logic "0" produced on conductor 85 results in a logic "1" state at the output of NOR gate 94. This logic "1" state couples to the clock inputs of the flip-flops comprising data register 18 and causes the contents of data register 16 to be transferred into data register 18.

In a manner similar to the previous description for status flip-flop 90, the new state of status flip-flop 88 establishes conditions for updating the status register at the next negative clock transition at time 154. The logic states of status flip-flop 88 and status flip-flop 86 result in logic "1" at the output of control NOR gate 110 which connects to an input of status flip-flop 88. This condition sets status flip-flop 88 to the logic "1" state at the next negative clock transition at time 154. Similarly, the logic "1" at the $\overline{\text{Q}}$ output of status flip-flop 88 connects to an input of control NOR gate 102, forcing the output of NOR gate 102 to logic "0" state. This logic "0" connects to an input of status flip-flop 86 and establishes the condition which clears status flip-flop 86 to the logic "0" state at the next negative clock transition at time 154. Thus, the status register is updated to the (0,1,1) state indicating that the contents of data register 16 have been shifted into data register 18 in accordance with FIFO memory operating requirements.

The next phase in the operation of the logic of FIG. 1 varies slightly since data must now be supplied to data register 16 via the external data input conductor 22, 24 and 26 rather than via internal data transfer. The new register status (0,1,1) results in a logic "0" state on the $\overline{\text{WRITE READY}}$ conductor. This state indicates that the FIFO memory is now ready to receive new data. The availability of data for transfer into data register 16 is indicated by a logic "0" state on $\overline{\text{WRITE FIFO}}$ input which connects to an input of NOR gate 92 via conductor 98. The inverted clock signal connected to the other input of NOR gate 92 results in the logic "1" state on WRITE FIFO conductor 34 at time 156 as shown in FIG. 2. The logic "1" state on conductor 34 connects to the clock inputs of the flip-flops of data register 16 and causes the data present on the data input conductors 22, 24 and 26 to be transferred into data word 16. The logic "1" state on conductor 34 also connects to the data input of status flip-flop 86 and causes an update of status flip-flop 86 to the set state when the next negative clock transition occurs at time 158. Thus the status register has been updated to the (1,1,1) state indicating that the FIFO memory is once again full.

The timing diagram of FIG. 2 shows continuation of the logic operation of the logic of FIG. 1 wherein logic "1" signals on the READ FIFO input to the FIFO memory in conjunction with the negative clock transitions at times 160, 162, 164, 166 and 168 cause transfer of data out of data register 20 and internal data transfers between the other data registers of the FIFO memory to transfer all data out of the FIFO memory with the resulting register status of (0,0,0) after time 168. The status flip-flops, transfer enable gates and control gates operate as described previously during these data transfer operations.

The above explanation of the operation of the logic circuit of FIG. 1 has described the FIFO memory system of the present invention in terms of a particular embodiment which uses only three data registers. It is clear that the novel structure of the present invention which allows those data registers to be made up of simple single rank storage elements can be extended to FIFO memories of any size. The advantages resulting from the use of single rank storage elements in reducing component count and, in integrated circuit implementations, correspondingly reducing chip size and manufacturing costs are differentially greater in large FIFO memories systems where the proportion of single rank storage elements to double rank status and control elements is greater.

What is claimed is:

1. A first in-first out memory system including in combination:
    a. storage array means comprising data registers formed of single rank storage elements for storing binary information;
    b. status record means for recording whether each of said data registers is full or empty;
    c. control logic means coupled to said status record means and to said storage array means for sequencing transfer of data within said storage array means, said transfer occurring only between adjacent data registers whose status record shows an empty data register preceded by full data register.

2. A first in-first out memory system as recited in claim 1, wherein said status record means comprises a status flip-flop whose logical state provides a record of whether an associated data register is empty or full.

3. A first in-first out memory system as recited in claim 2, wherein said control logic means comprises a transfer enable gate responsive to said status flip-flop for controlling transfer of data into an empty data register from a preceding full data register.

4. A first in-first out memory system as recited in claim 2, wherein said control logic means comprises a first control gate means coupled to said status flip-flop for setting said status flip-flop in said first logical state when data has been transferred into the associated data register.

5. A first in-first out memory system as recited in claim 2, wherein said control logic means comprises second control gate means coupled to said status flip-flop for:
    a. holding said status flip-flop in said first logical state when no data transfer out of said data register has occurred;
    b. holding said status flip-flop in said second logical state when no data transfer into said register has occurred; and
    c. clearing said status register to said second logical state when a data transfer out of said data register has occurred.

6. A first in-first out memory system comprising:
    a. first register means for storing data;
    b. second register means, coupled to said first register means, for storing data, said first and said second register means comprising single rank storage elements;
    c. first status register means coupled to said first register means, said first status register means having a first logical state for indicating that said first register means contains data and said first status register means having a second logical state for indicating that said first register means does not contain data;
    d. second status register means coupled to said second register means, said second status register means having a first logical state for indicating that said second register means contains data and said second status register means having a second logical state for indicating that said second status register means does not contain data; and
    e. control logic means coupled to said first and said second status register means and coupled to said first register means and said second register means, for transferring data from said second register means to said first register means when said second status register means is in the first logical state and when said first status register means is in the second logical state.

7. A first in-first out memory system as recited in claim 6 wherein said status register means comprise status flip-flops.

8. A first in-first out memory system as recited in claim 6 wherein said control logic means comprises a transfer enable gate.

* * * * *